(12) United States Patent
Doan et al.

(10) Patent No.: US 8,785,823 B2
(45) Date of Patent: *Jul. 22, 2014

(54) EXTENDING THE OPERATING TEMPERATURE RANGE OF HIGH POWER DEVICES

(75) Inventors: Edward D. Doan, Round Rock, TX (US); Anthony P. Ferranti, Raleigh, NC (US); Gary E. O'Neil, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 332 days.

This patent is subject to a terminal disclaimer.

(21) Appl. No.: 11/776,369

(22) Filed: Jul. 11, 2007

(65) Prior Publication Data

US 2009/0016408 A1 Jan. 15, 2009

(51) Int. Cl.
*H05B 1/02* (2006.01)

(52) U.S. Cl.
USPC .......................... 219/491; 219/497; 219/511

(58) Field of Classification Search
USPC ................... 219/209, 491, 497, 511; 323/366
See application file for complete search history.

(56) References Cited

U.S. PATENT DOCUMENTS

| | | | |
|---|---|---|---|
| 4,086,467 A * | 4/1978 | Grant | 219/544 |
| 4,675,777 A | 6/1987 | Watrous | |
| 5,324,916 A | 6/1994 | Goto et al. | |
| 5,369,245 A | 11/1994 | Pickering | |
| 5,774,331 A | 6/1998 | Sach | |
| 5,911,897 A | 6/1999 | Hamilton | |
| 6,046,433 A | 4/2000 | Gross et al. | |
| 6,389,225 B1 | 5/2002 | Malinoski et al. | |
| 6,525,354 B2 | 2/2003 | Masleid | |
| 6,621,055 B2 * | 9/2003 | Weber et al. | 219/494 |
| 6,917,237 B1 | 7/2005 | Tschanz et al. | |
| 7,050,959 B1 | 5/2006 | Pollard et al. | |
| 8,086,358 B2 | 12/2011 | O'Neil | |
| 2003/0038332 A1 * | 2/2003 | Kimura | 257/467 |

(Continued)

FOREIGN PATENT DOCUMENTS

| | | |
|---|---|---|
| EP | 0540287 A2 | 10/1992 |
| JP | 05-029428 | 2/1993 |

(Continued)

OTHER PUBLICATIONS

U.S. Appl. No. 11/776,340, "Utilization of Overvoltage and Overcurrent Compensation to Extend the Usable Operating Range of Electronic Devices," Restriction Requirement dated Jan. 23, 2012.

(Continued)

*Primary Examiner* — John Wasaff
(74) *Attorney, Agent, or Firm* — Yudell Isidore Ng Russell PLLC

(57) ABSTRACT

A method and system for efficiently extending the operating temperature range of high power components within a system/device. An embedded monitor measures local temperatures such as junction temperatures of components. When the measured temperature is less than the lowest operational temperature threshold of the component, temperature control logic initiates pre-heating to raise the component's temperature to an operational level, utilizing a heating source. The component (or device) is made operational only when the temperature is at or above the operational level. The temperature control logic maintains the operational temperature of the component using the high power dissipated by components within the operating system/device as a self heating source. If self heating is unable to maintain the operational temperature, the heating source is utilized to assist in maintaining the component's operational temperature, and thereby extends the useable operational temperature range of the system in which the components are employed.

20 Claims, 5 Drawing Sheets

(56) References Cited

U.S. PATENT DOCUMENTS

2005/0268133 A1    12/2005    Beard
2009/0014433 A1     1/2009    O'Neil

FOREIGN PATENT DOCUMENTS

| | | |
|---|---|---|
| JP | 05-226440    | 9/1993 |
| JP | 05-235254    | 9/1993 |
| JP | 07153876 A   | 6/1995 |
| JP | 2000101276 A | 4/2000 |
| JP | 2003309317 A | 10/2003 |
| JP | 2004221157 A | 8/2004 |
| JP | 2006135186   | 5/2006 |
| JP | 2006351979 A | 12/2006 |

OTHER PUBLICATIONS

U.S. Appl. No. 12/776,340 entitled "Utilization of Overvoltage and Overcurrent Compensation to Extend the Usable Operating Range of Electronic Devices"; Notice of Allowance dated Aug. 20, 2012.

U.S. Appl. No. 12/776,340 entitled "Utilization of Overvoltage and Overcurrent Compensation to Extend the Usable Operating Range of Electronic Devices"; Non-final office action dated May 9, 2012.

U.S. Appl. No. 12/776,340 entitled "Utilization of Overvoltage and Overcurrent Compensation to Extend the Usable Operating Range of Electronic Devices"; Non-final office action dated Jan. 23, 2012 (Restriction requirement).

U.S. Appl. No. 11/776,353, "Method for Pre-Heating High Power Devices to Enable Low Temperature Start-Up and Operation," Notice of Allowance dated Aug. 23, 2011.

U.S. Appl. No. 11/776,353, "Method for Pre-Heating High Power Devices to Enable Low Temperature Start-Up and Operation," Non-Final Office Action dated Jul. 16, 2009.

Zurek et al., "Elevated Temperature Performance of Pseudomorphic AlGaAs/AnGaAs MODFET's" IEEE 1998 p. 2-8.

Japan Application No. 2008-173209 Filing Date: Jul. 2, 2008 Applicant: Edward D. Doan, et al. JPO Office Action Dated Sep. 18, 2012—Information Materials for IDS.

* cited by examiner

EXTENDING THE OPERATING TEMPERATURE RANGE OF HIGH POWER DEVICES

RELATED APPLICATIONS

The present application is related to the subject matter of the following co-pending applications, filed concurrently herewith and similarly assigned. The content of the related applications are incorporated herein by reference:

Ser. No. 11/776,353 and titled "Method for pre-heating high power devices to enable low temperature start-up and operation"; and Ser. No. 11/776,340 and titled "Utilization of Overvoltage and Overcurrent Compensation to Extend the Usable Operating Range of Electronic Devices."

BACKGROUND OF THE INVENTION

1. Technical Field

The present invention generally relates to electronic devices and in particular to temperature control in electronic devices.

2. Description of the Related Art

High performance (and high power) application specific integrated circuit (ASIC) and microprocessor designs are optimized for the relatively high ambient temperatures surrounding the systems in which these devices are frequently employed. However, many applications also require operation of these devices at low ambient temperatures. For example, some harsh industrial and military applications require equipment to work reliably at temperatures as low as negative 40 degrees (Centigrade and Fahrenheit converge at this level). With little focus given to operation of devices at lower temperatures, many of these high performance devices function unreliably or even fail to initialize at very low temperatures.

SUMMARY OF THE INVENTION

Disclosed is a method and system for efficiently extending the operating temperature of high power devices. Temperature control logic utilizes an embedded thermal sensor to locally monitor temperatures within key components of a host device or system. When the measured temperature is less than the low threshold for operating temperature of the device, the temperature control logic initiates pre-heating to raise the device's temperature to an operational level before applying system power to make the device operational. The temperature control logic utilizes a heating source embedded within or attached to the host device to provide the pre-heating. The temperature control logic maintains the operational temperature of the device by using the power dissipated by components within the operating device (i.e., self heating) as a heating source. If self heating is unable to maintain the device's temperature above the low threshold temperature, the embedded or attached heating source is utilized to assist in maintaining the device's operational temperature. The embedded or attached heating source operates along with the self heating processes to extend the low end of the operational temperature range of the device.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
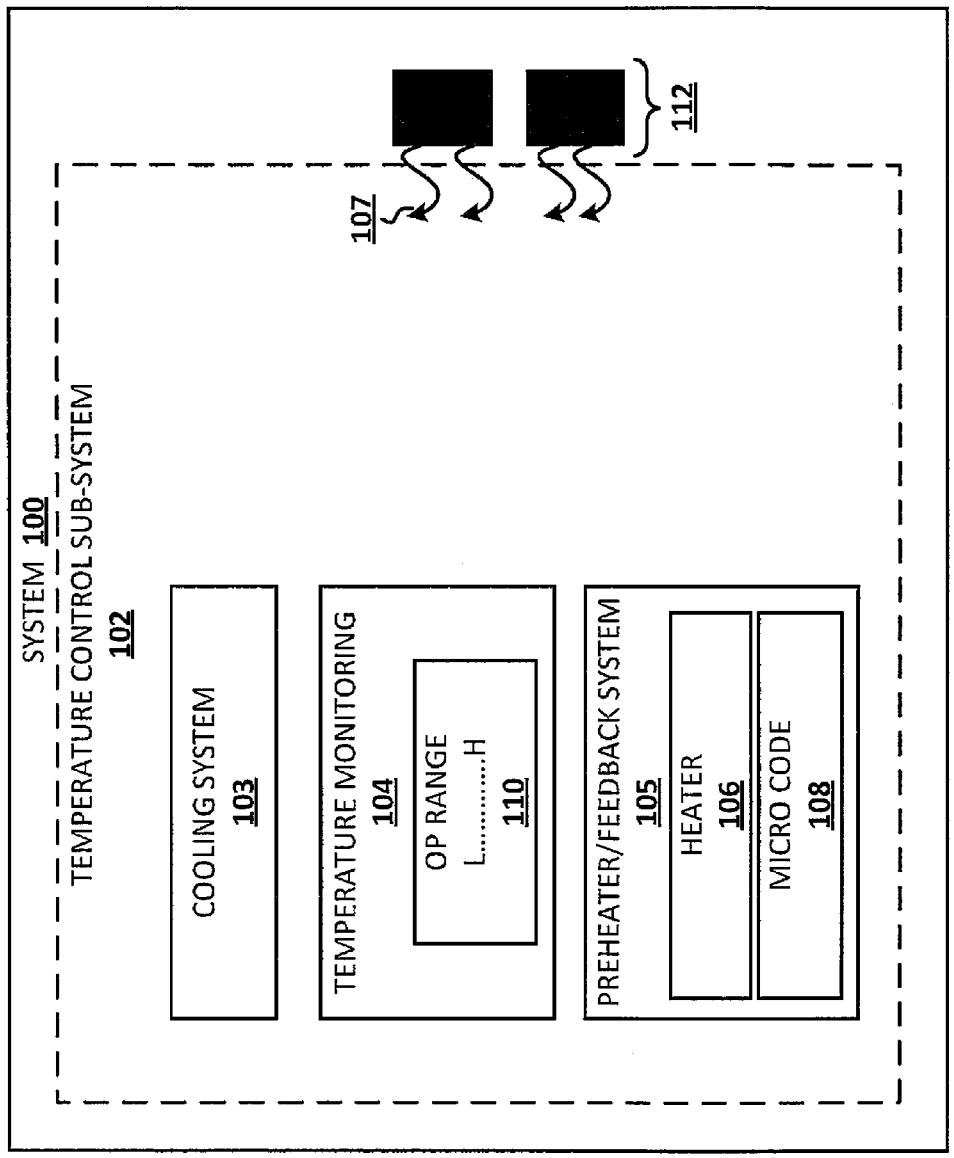
FIG. 1 is a block diagram illustrating a system having high power devices and temperature control logic according to one embodiment of the invention.

The described embodiments provide a method and system for efficiently extending the operating temperature range of high power devices. Temperature control logic utilizes an embedded thermal sensor to monitor junction temperatures within a host device. When the measured temperature is less than the low threshold for operating temperature of the device, the temperature control logic initiates pre-heating to raise the device's temperature to within operational limits before applying system power. The temperature control logic utilizes a localized heating source embedded within the host device to provide the pre-heating. The temperature control logic maintains the operational temperature of the device by using the power dissipated by components within the operating device (i.e., self heating) as a heating source. If self heating is unable to maintain the device's temperature above the low threshold temperature, the embedded heating source is utilized to assist in maintaining the device's operational temperature. The embedded heating source operates along with the self heating processes to extend the low end of the operational temperature range of the device, independent of the surrounding ambient temperature.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s). Where a later figure utilizes the element in a different context or with different functionality, the element is provided a different leading numeral representative of the figure number (e.g, 2xx for FIG. 2 and 3xx for FIG. 3). The specific numerals assigned to the elements are provided solely to aid in the description and not meant to imply any limitations (structural or functional) on the invention.

It is also understood that the use of specific parameter names are for example only and not meant to imply any limitations on the invention. The invention may thus be implemented with different nomenclature/terminology utilized to describe the above parameters, without limitation.

With reference now to the figures, FIG. 1 is a block diagram depicting an example system within which features of the invention may be advantageously implemented. System 100 is a high performance/power system which comprises temperature control sub-system 102 and high power devices 112 (also referred to interchangeably herein as key components). Temperature control system 102 comprises: (1) Temperature sensor(s) 104; (2) Cooling system 103; and (3) Pre-heater & feedback system 105. Pre-heater & feedback system 105 also comprises heater 106. High power components 112 are components (of a functional device) that experience high levels of power dissipation (107), and resulting increase in temperature of system 100. The temperature is detected and regulated by temperature control sub-system 102. For purposes of the described embodiments, high power components 112 represent those components that require operation within a pre-established range of temperature, with a low (or minimum) threshold temperature and a high threshold temperature.

According to the illustrative embodiment, temperature control system 102 completes a series of functional processes using the illustrated components within system 100, including: (1) monitoring a temperature of key components (112) relative to a lowest operational temperature of the key components; (2) preheating high power components 112 to the low operational temperature threshold of high power components 112 when the temperature of the high power components 112 is below the low operational temperature threshold; (3) exploiting the self heating properties of high power components 112 to maintain an operating temperature above the low operating temperature threshold; and other features/functionality described below and illustrated by FIGS. 2-5. As further illustrated, pre-heater & feedback system 105 may also include microcode 108, which activates the second and third functional features above when executed.

Before the device containing high power components 112 becomes operational, the temperature of high power components 112 is raised to an operational temperature level (at or above the low operational temperature threshold). In order to raise the temperature to an operational level, heater 106 within pre-heater and feedback system 105 is activated (i.e., heater 106 is provided a source of power in order to generate heat). Once the high power components 112 attain operational temperature levels, system power is applied and an initialization procedure commences, which concludes when the device becomes operational. When the device becomes operational, self heating, which results from high power dissipation 107 commences, and heating by heater 106 is gradually reduced until self heating is able to maintain the device temperature above the low operational temperature threshold. High power components 112 are responsible for self heating, which (self heating) is utilized to maintain an operational device temperature after the device becomes operational.

The temperature control subsystem includes logic for activating the heater by applying power to the heater when the current device temperature is less than the lowest operational temperature threshold. The logic also removes or reduces power applied to the heater when the current temperature is at or above the lowest operational temperature threshold. Any source of power may be utilized to power the heater, including the main power that is later applied to the key components following device initialization or a separate power source for the temperature control sub-system.

Figure 2:
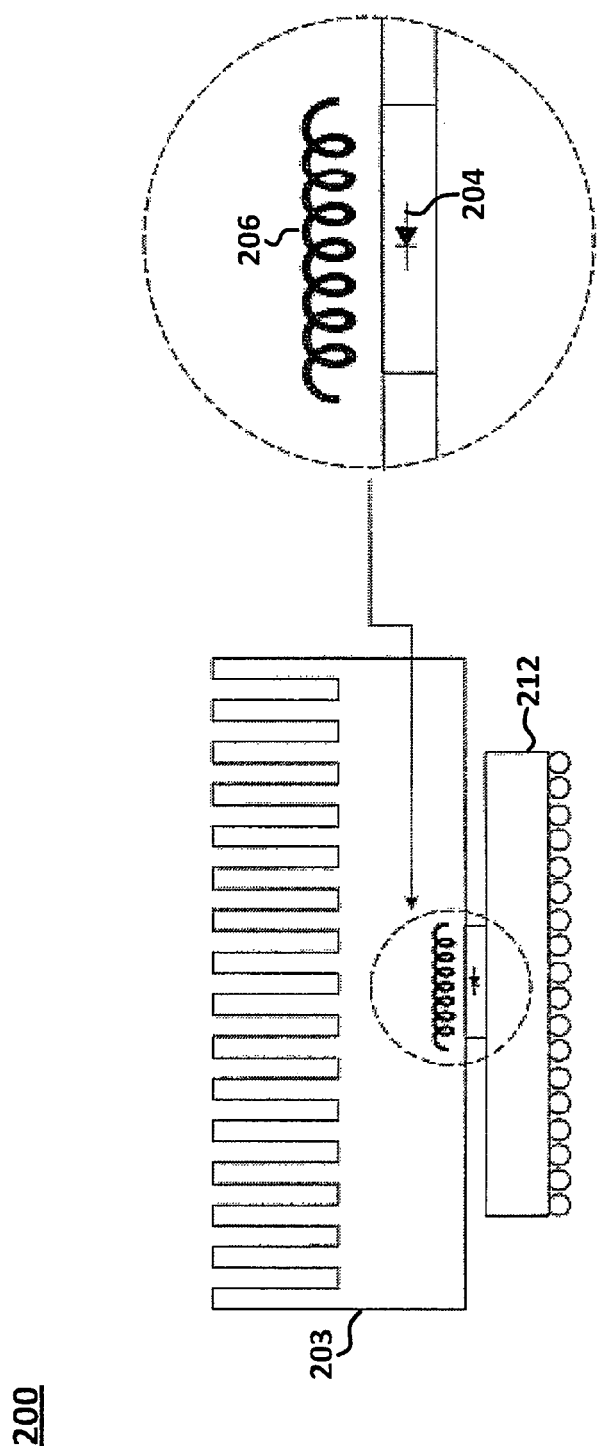
FIG. 2 illustrates a cross sectional view of various components responsible for heating, cooling and temperature monitoring of a host device, according to an illustrative embodiment of the present invention.

In one embodiment and as shown by FIG. 2, described below, temperature sensor 104 is an embedded thermal diode which measures the temperature of key components 106 with reference to a low operational temperature threshold (L) 110. The temperature detected by the thermal diode, i.e., the junction temperature is determined by measuring a forward bias voltage of the diode, which voltage varies linearly with temperature.

Referring now to FIG. 2, there is depicted a device-level (cross sectional) view of components involved with heating, cooling and temperature monitoring of a host device, according to an illustrative embodiment of the present invention. Host device 200 comprises heat sink 203 which is thermally coupled to thermal diode 204. Thermal diode 204 is also thermally coupled to high power (dissipating) component 212 of host device 200.

Embedded thermal diode 204 of the host device (or heat sink) produces a forward bias voltage that varies linearly with temperature, and the diode does not require operation of the host device to provide this implicit temperature measurement. The forward biased diode voltage which represents the lowest operating temperature of the host device or system is determined through characterization and/or calibration during or prior to a system design and/or final test. A comparator (voltage threshold detector) is configured to toggle the comparator's output at a voltage threshold representative of the diode's forward bias voltage when the device's temperature reaches the lowest operating temperature of the host device or system.

Thermal diode 204 functions as a reliable thermal monitor of ambient temperature prior to and at system startup, since thermal diode 204 is capable of accurately reflecting the stabilized (average) system ambient temperature when no power is or has been applied. In addition, thermal diode 204 provides a strategic monitor of maximum system operating temperature by virtue of the proximity of thermal diode 204 to the high power dissipation devices (for example, high power component 212) within the host system.

Embedded in heat sink 203 is heater 206 (illustrated as a heater coil), which is located substantially adjacent to thermal diode 204, as illustrated in host device 200. Heater 206 is primarily utilized in the initialization (start up) process when the temperature of high power component 212 within host device 200 is below the low operational temperature threshold of the component 212. Heater 206 enables the preheating of host device 200 and specifically key components, such as high power component 212 up to a low operational temperature threshold. Pre-heating in this manner accelerates the system start up process. In one embodiment, as further described herein, heater 206 may also be utilized after the host device 200 becomes operational to assist the self heating mechanism(s) in maintaining the operational device temperature.

The actual locations/positions of the above described components may vary relative to each other, and the illustrative embodiment is provided solely to illustrate one possible implementation and not intended to limit the invention to the illustrated configuration. Also, while illustrated as a thermal diode, many other devices may be utilized to provide the temperature monitoring function described herein, including thermistors (temperature sensitive resistors), bimetallic thermocouples or thermostats, et al., and the specific use of a thermal diode is simply for illustrating the function of temperature monitoring, and not intended to be limiting on the invention.

Figure 3:
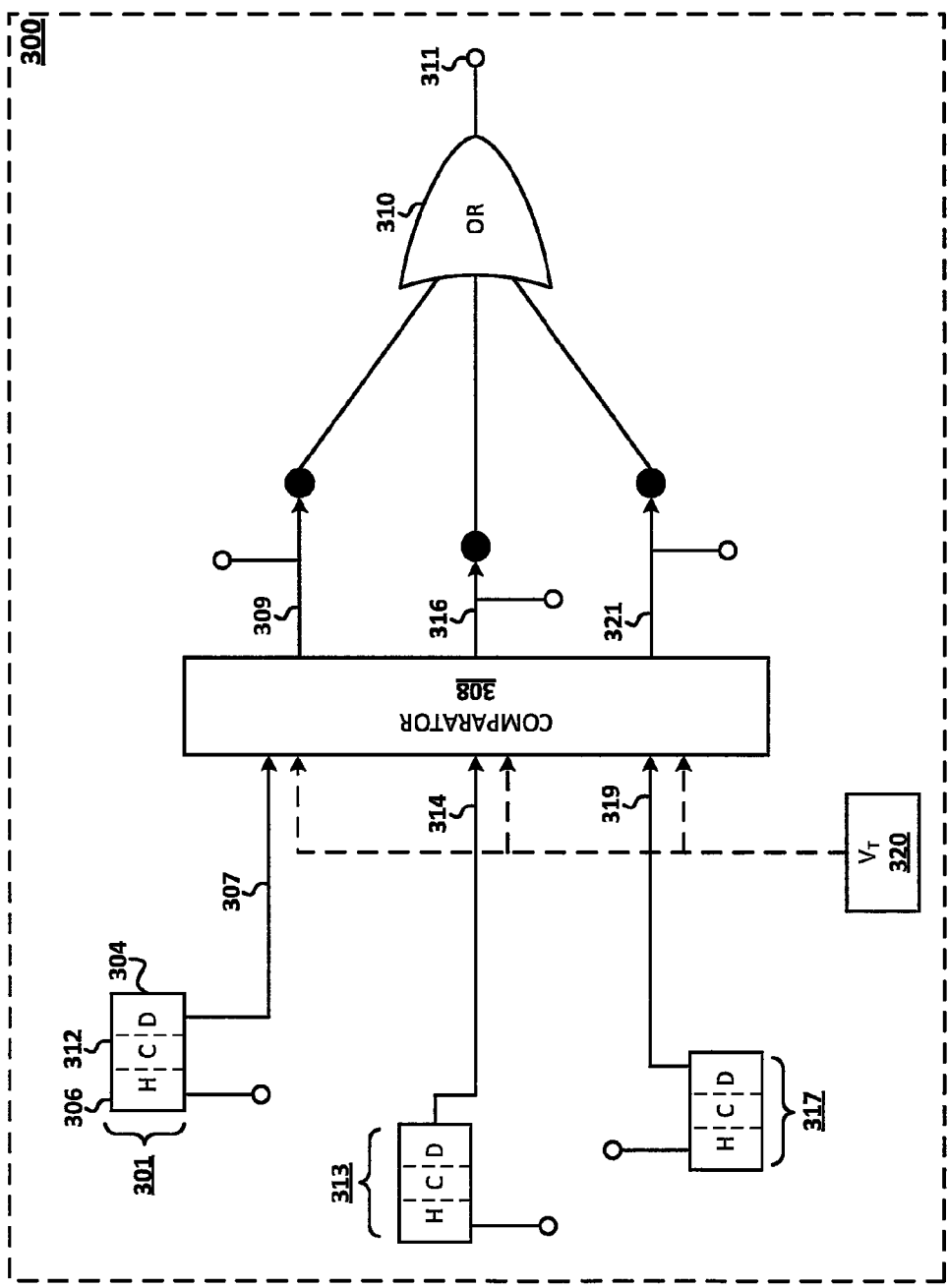
FIG. 3 is a block diagram which illustrates localized (granular) temperature control for key components of a high power device, according to an illustrative embodiment of the present invention.

FIG. 3 illustrates a system of localized temperature control for key components of a high power system, according to an illustrative embodiment of the present invention. Localized Temperature Control Logic (LTCL) 300 comprises multiple Temperature Control Subsystems (TCS) 301, 313, 317. TCS 301, 313, 317 provide respective temperature outputs 307, 314, 319 as inputs to comparator 308. In LTCL 300, first TCS 301 comprises heater (H) 306, key component (C) 312 and thermal diode (D) 304. Second TCS 313 and third TCS 317 are similarly configured to first TCS 301 and comprise similar elements. Thermal diode 304 generates a voltage that is representative of the present temperature of key component 312 and that voltage value (or corresponding current) output 307 generated by first TCS 301 is fed into comparator 308. Similarly, comparator 308 receives second input (314), generated by second TCS 313, and third input (319), generated by third TCS 317. Comparator 308 also receives a calibrated input of the reference value of thermal diode voltage (VT) 320 that corresponds to the low operational temperature threshold of the device (305). This thermal diode voltage is illustrated by VT 320 in LTCL 300. Each of TCS 301, 313, 317 voltage outputs, as first input (307), second input (314) and third input (319) of comparator 308 is compared to the thermal diode voltage (VT) 320 corresponding to the lowest operational temperature threshold. Thus, VT 320 supplies comparator 308 with pre-established input(s) for comparison with each corresponding input generated by the TCS 301, 313, 317. Comparator 308 yields three outputs, one for each comparison, namely first output 309, second output 316 and third output 321. These outputs are respectively connected to the inputs of OR gate 310. OR gate 310 provides an output signal 311 representing the operational temperature status of the key components.

Each of the three outputs yielded by comparator 308, first output 309, second output 316 and third output 321 indicates whether a low temperature threshold is attained by the corresponding key component. Where individual pre-heaters are provided for each key component (312), the outputs of comparator 308 are forwarded to respective pre-heat and feedback circuits for that component. However, when such granular treatment is not supported, as when there is a single pre-heat and feedback circuit for the entire device, the output signal 311 of OR gate 310 is utilized to determine whether to continue (or initiate) pre-heating of the entire device. Output signal 311, the output of OR gate 310 indicates whether all key components (312) have attained an operational temperature. When all components have attained an operational temperature, system power is applied to all key components. Consequently, all heaters, including heater 306 of first TCS 301 are subsequently deactivated and self heating is relied upon for maintaining an operational temperature for each key component. It should be noted that while illustrated as an OR gate, alternate embodiments may be implemented in which other implementation of OR logic function or and an AND logic function is utilized to determine when one or more of the key components have not attained the respective operational temperature.

Figure 4:
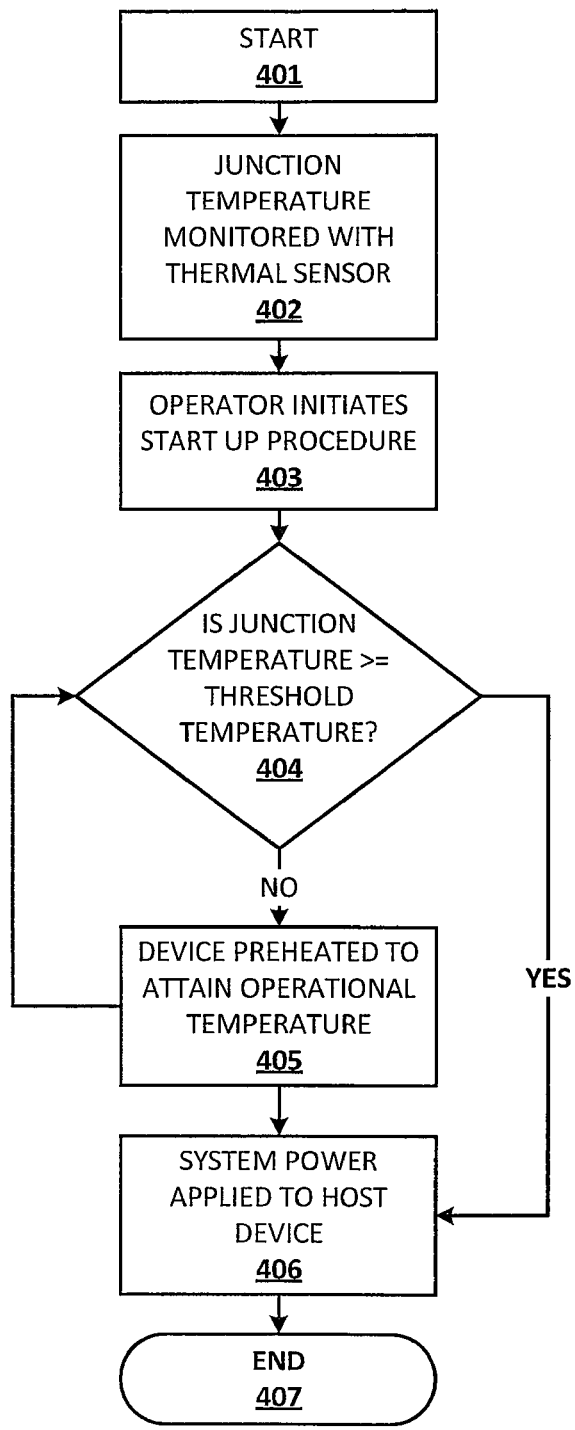
FIG. 4 is a flow chart which illustrates the process of applying a preheating mechanism to attain temperature levels within the operating temperature range of high power devices, according to an illustrative embodiment of the present invention.

FIG. 4 illustrates the process of applying a preheating mechanism to attain the low operating temperature levels of the operating temperature range of high power components, according to an illustrative embodiment of the present invention. The process begins at block 401, and proceeds to block 402, at which the junction temperature of an embedded (or attached) thermal sensor (e.g. thermal diode 204 of FIG. 2) within the host device is monitored.

At block 403, a start up or power on procedure is initiated for the device's core components. In one embodiment, the start up procedure may be triggered by receipt of a hard user activation of a system "on" button/switch. Alternatively, a pre-programmed facility may initiate the device's start up procedure based on a pre-set condition or time/interval. The temperature control logic determines, at block 404, whether the junction temperature measured by the thermal diode is less than the low operational temperature threshold of the device. If the junction temperature is less than the lowest operational temperature threshold of the component being monitored, the process moves to block 405, at which, the host device is pre-heated utilizing a heater (e.g., heater 206 in FIG. 2) in order to heat the device (specifically the component and/or area surrounding the component) up to the lowest operational temperature threshold of that component.

In an alternate embodiment, in which multiple components are arranged with strategically placed forward biased diode sensors and localized pre-heaters (FIG. 3), individualized (granular) pre-heating of components may be provided by respective localized pre-heaters. This alternate embodiment enables independent monitoring and subsequent independent heating. However, as also described above, host device-level pre-heating may be supported with this multiple-component configuration by providing an AND or OR logic function to (a) determine when any one component is below the lowest operational temperature threshold and (b) trigger pre-heating of one or more of the key components individually, collectively, and/or with or without preheating of the host device (or system) in which the independent TCS 301 are incorporated. The results returned by the logical OR operation(s) indicate whether additional pre-heating is required or if one or more of the key components of the host device are ready to accept a supply of system power. Individually, or together, the implementation used is selected to improve system performance and reliability, by extending the lower limit of usable operating temperature of the key components. Returning to the flow chart, if at block 404 the junction temperature is greater than or equal to the lowest operational threshold temperature of the device, the process moves to block 406, at which, system power is applied to the host device. The application of system power is accompanied by an initialization procedure. The initialization procedure concludes with the host device being operational. The process ends at block 407.

Figure 5:
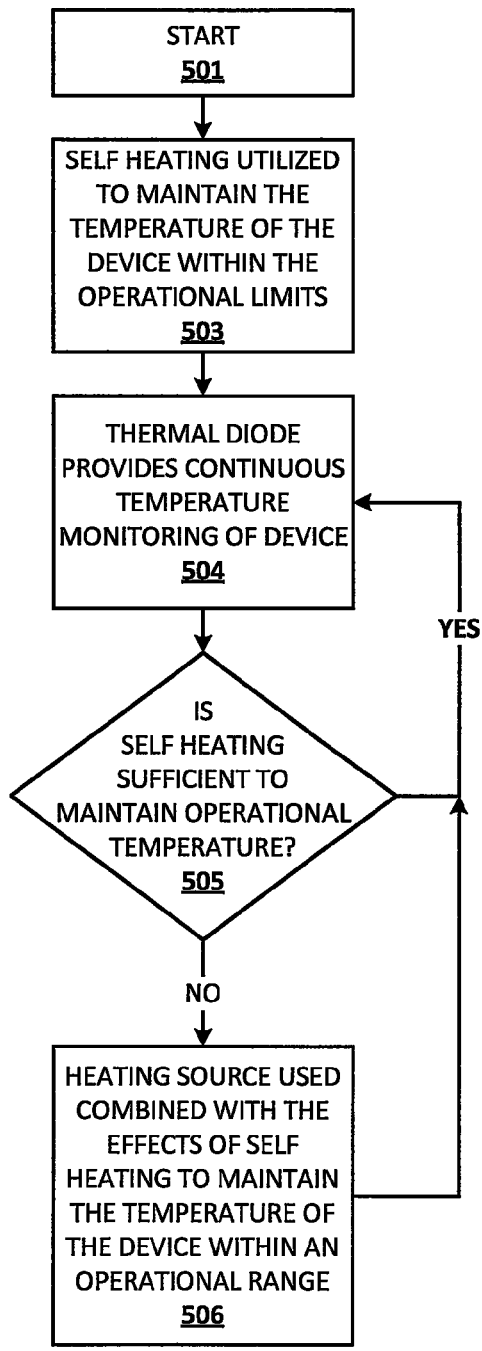
FIG. 5 is a flow chart which illustrates the process of combining pre-heating and self heating mechanisms to maintain temperature levels within the operating temperature range of high power devices, according to an illustrative embodiment of the present invention.

FIG. 5 illustrates the process of applying a combination of pre-heating and self heating mechanisms to maintain temperature levels within the operating temperature range of high power components within a device/system designed with the above described temperature control logic, according to an illustrative embodiment of the present invention. The process begins at block 501 at which the high power component is in an operational mode. The sequence of steps illustrated in FIG. 4 and described above outlines a possible procedure for reaching the operational temperature prior to device operation. Once the device is operational, high power dissipation of components within the device provides self heating, which is utilized to maintain the temperature of the device within the operational temperature limits, as shown at block 503. The thermal diode continuously monitors the component's temperature, as provided at block 504. At block 505, the temperature control logic determines whether self heating is sufficient to maintain the operational temperature. This determination is made based on a comparison of the junction temperature detected by the thermal diode against the lowest operation temperature threshold. If, at block 505, self heating is not sufficient to maintain an operational temperature above the lowest operational temperature threshold, the process moves to block 506, at which, the embedded heater (employed within the feedback system to regulate the amount of heating and provide pre-heating) is utilized to generate additional heat and maintain the operational temperature above the lowest temperature threshold.

The heater is provided power to assist in maintaining the operating temperature above the lowest operating temperature threshold if the localized temperature of the device's key components falls below a self heating threshold. The falling of the junction temperature below the self heating threshold indicates that self heating by the device is insufficient to sustain the operating temperature above the lowest operating temperature. Thus, the embedded heater is used, combined with the effects of self heating, to maintain the temperature of the component within the operational temperature range for the key components. However, if self heating is sufficient to maintain an operational temperature, the embedded heater is not activated.

Monitoring of the component's junction temperature (or generally any "hot spot" within a system that is problematic when that location of the system is at low temperatures) continues while the device is operational. The use of both the heat generated from the heater and the self heating process (heat dissipation from components within the device) may also be applied to extend the usable ambient operating temperature range of the device even lower, since it is the critical parameter of junction temperature, which is independent of ambient temperature, that is regulated to maintain the key component or components within their operational limits. With this process, system performance may be guaranteed independent of ambient temperature, allowing for operation below guaranteed ambient limits by an amount equal to the thermal rise of the junction temperature of the component relative to the system ambient temperature (attributed by the heater or self heating) of the device.

While the invention has been particularly shown and described with reference to the illustrated embodiments, it will be understood by those skilled in the art that various changes in form and detail may be made therein without departing from the spirit and scope of the invention. For example, other mechanisms for detecting localized heat other than the use of thermal diodes may be provided in alternate embodiments.

What is claimed is:

1. A host device comprising:
    an integrated circuit (IC) component that operates above a lowest operational temperature threshold, which represents a temperature at and above which the IC component is required to be at before operation of the IC component; and
    a temperature control subsystem having:
        an embedded thermal sensor that detects a current temperature of the IC component and when the current temperature of the IC component is below the lowest operational temperature threshold; and
        a heater embedded within a heat sink of the host device that is selectively activated to generate heat, which increases the current temperature of the IC component, wherein the heater provides automatic preheating of the IC component from the current temperature below the lowest operational temperature threshold to a higher temperature above the lowest operational temperature threshold prior to initiating an operation of the IC component, wherein the heater is a heater coil, and wherein the embedded thermal sensor is attached to the IC component and the heat sink;
    wherein the automatic preheating is accomplished by component self-heating via pre-operation power dissipation from the IC component and one or more other components of the host device and heating via the embedded heater.

2. The host device of claim 1, wherein the embedded thermal sensor is calibrated to detect and generate an output indicative of the current temperature of the IC component including temperatures below the lowest operational temperature threshold.

3. The host device of claim 2, wherein in response to the current temperature of the IC component being less than the lowest operational temperature threshold, the temperature control subsystem:
    activates the heater by applying power to the heater;
    removes power from the heater when the current temperature of the IC component is above the lowest operational temperature threshold; and
    in response to detecting, via the embedded thermal sensor, that the current temperature of the IC component is equal to the lowest operational temperature threshold, supplies power to the IC component.

4. The host device of claim 1, wherein the temperature control subsystem further:
    detects when the IC component becomes operational;
    regulates the current temperature of the IC component using a combination of the heat sink and heat dissipation from the IC component, wherein the heat dissipation provides self-heating that is utilized to maintain the current temperature at least equal to or above the lowest operational temperature threshold, wherein self-heating is utilized to maintain the current temperature after power is applied to the IC component and the host device becomes operational;
    detects when the current temperature of the IC component falls below the lowest operational temperature threshold, indicating that self-heating is not sufficient to maintain the current temperature above the lowest operational temperature threshold; and
    in response to detecting the current temperature of the IC component has fallen below the lowest operational temperature threshold, activates the heater to generate heat independent of the self-heating to assist in maintaining the current temperature above the lowest operational temperature threshold.

5. The host device of claim 4, the temperature control subsystem further:
    triggers activation of the heater to generate heat in conjunction with self-heating to extend an operating temperature range of the host device;
    wherein the combination of heat generated from the heater and the self-heating of one or more other components of the host device extend a lower limit of an operating temperature range of the host device.

6. The host device of claim 2, wherein:
    the embedded thermal sensor is a thermal diode which produces a forward bias voltage which correlates to the current temperature of the IC component; and
    the temperature control subsystem further determines when the forward bias voltage correlates to a temperature that indicated the current temperature of the IC component is below the lowest operational temperature threshold.

7. The host device of claim 2, wherein:
    the IC component is a first IC component having a corresponding first embedded thermal sensor and first operational temperature thresholds;

the host device has a second IC component having a corresponding second embedded thermal sensor and second operational temperature threshold; and
the temperature control subsystem further:
granularly determines when the current temperature of at least one of the first IC component and the second IC component is below its respective lowest operational temperature threshold; and
triggers activation of the heater when the current temperature of at least one of the first IC component and the second IC component is below the lowest operational temperature threshold for that component to locally increase the current temperature of the at least one of the first IC component and the second IC component.

8. The host device of claim 2, further comprising:
a plurality of IC components, wherein each of the plurality of IC components has a separate heater, a separate embedded thermal sensor, and a corresponding lowest operational temperature threshold; and
wherein the temperature control subsystem further granularly activates the separate heater of only one or more specific IC components from among the plurality of IC components having a current temperature that is below the corresponding lowest operational temperature threshold to increase the current temperature of only the one or more specific IC components.

9. The host device of claim 2, further comprising a plurality of IC components each having an individual, respective, lowest operational temperature threshold, the temperature control subsystem further comprising:
a plurality of embedded thermal sensors that are individually associated with respective ones of the plurality of IC components;
a comparator mechanism which receives inputs from the plurality of embedded thermal sensors and compares the inputs from the plurality of embedded thermal sensors with corresponding ones of the individual lowest operational temperature thresholds for the associated IC components to yield a plurality of compared outputs;
wherein the temperature control subsystem further combines the plurality of compared outputs to yield one of:
a first combined output that indicates when at least one component of the plurality of IC components is not above its respective lowest operational temperature threshold; and
a second combined output that indicates that all of the plurality of IC components are above their respective lowest operational temperature thresholds;
wherein the activating the heater to provide heat further comprises in response to receiving the first combined output, the temperature control subsystem triggers activation of the heater to heat the plurality of IC components.

10. A system comprising:
an integrated circuit (IC) component that operates within an operational temperature range, which includes a lowest operating temperature;
at least one embedded thermal sensor for monitoring a current temperature of the IC component relative to the lowest operational temperature of the IC component;
at least one heater embedded within a heat sink of the system that is selectively activated to generate heat, which increases the current temperature of the IC component, wherein the at least one heater is a heater coil, and wherein the embedded thermal sensor is attached to the IC component and the heat sink; and
a temperature control subsystem that is configured to:
control the at least one heater to pre-heat the IC component from a detected current temperature below the lowest operational temperature to a higher temperature above the lowest operational temperature of the IC component when the temperature of the IC component is below the lowest operational temperature and the system is to be made operational; and
in response to the IC component being preheated to a temperature above the lowest operational temperature, apply system power to the system, wherein the system power is only applied to the system to enable the IC component within the system to become fully operational after the current temperature of the IC component is at least as high as the lowest operational temperature;
wherein the preheating is accomplished by component self-heating via pre-operation power dissipation from the IC component and one or more other components of the system and heating via the at least one heater.

11. The system of claim 10, wherein:
the embedded thermal sensor is a thermal diode which produces a forward bias voltage which correlates to the current temperature of the IC component, wherein the embedded thermal sensor is calibrated to detect and generate an output indicative of the current temperature of the IC component including temperatures below the lowest operational temperature; and
the temperature control subsystem is further configured to:
compare the forward bias voltage with a pre-set reference forward bias voltage that represents the lowest operational temperature of the IC component to determine if the current temperature of the IC component is below the lowest operational temperature.

12. The system of claim 10, wherein controlling further comprises the temperature control subsystem preheating the area surrounding the IC component by activating the heat generating mechanism to preheat the IC component when the current temperature of the IC component is less than the lowest operational temperature of the IC component.

13. The system of claim 10, the temperature control subsystem is further configured to:
maintain the temperature of the IC component within the operational temperature range by balancing heat dissipated by the system via self-heating and an amount of cooling applied to the IC component;
activate the at least one heater to generate additional heat in combination with the self-heating when the current temperature of the IC component falls below the lowest operational temperature during operation of the system, indicating that the heat dissipated by the system as self-heating is not sufficient to maintain the current temperature of the IC component within the operational temperature range;
receive feedback from the embedded thermal sensor; and
in response to receiving the feedback, selectively activate the at least one heater in a regulated manner to maintain the current temperature of the IC component within the operational temperature range;
wherein operation of the system is enabled at temperatures below guaranteed ambient limits by an amount substantially equal to a thermal rise of the IC component due to the at least one heater and self-heating; and
wherein the combination of heat generated from the at least one heater and the self-heating of one or more other components of the system extend a lower limit of an operating temperature range of the system.

14. The system of claim 10, further comprising:
a plurality of components having individual, respective, lowest operational temperatures;
a plurality of embedded thermal sensors that are individually associated with respective ones of the multiple components;
a plurality of heaters that are individually associated with respective ones of the plurality of components;
a comparator mechanism which receives inputs from the plurality of embedded thermal sensors and compares the inputs with corresponding ones of the individual lowest operational temperatures for the associated components to yield a plurality of compared outputs;
wherein the temperature control subsystem is further configured to:
 combines the plurality of compared outputs to yield one of:
  a first combined output that indicates when at least one of the plurality of components is not above the lowest operational temperature of the at least one component; and
  a second combined output that indicates that all of the plurality of components are at above their lowest operational temperature; and
 in response to receiving the first combined output, activate one or more of the plurality of heaters to provide heat to the plurality of components, wherein activation of the one or more heaters is triggered in response to receiving the first combined output.

15. The system of claim 10, further comprising:
a plurality of IC components each having a separate heater and embedded thermal sensor, and each of the plurality of IC components also having a corresponding lowest operational temperature; and
wherein controlling the at least one heater to pre-heat the IC component further comprises granularly activate the separate heater of only one or more IC components among the plurality of IC components that have a current temperature that is below the corresponding lowest operational temperature, such that the current temperature of each of the one or more IC components is increased by activating a localized separate heater associated with each of the one or more IC components having a current temperature that is below the corresponding lowest operational temperature.

16. A method for extending an operating temperature of a host device having an integrated circuit (IC) component with a lowest operating temperature threshold comprising:
monitoring a current temperature of the IC component relative to a lowest operational temperature threshold for the IC component; and
in response to determining the current temperature of the IC component is below the lowest operational temperature threshold and the host device is to be made operational:
 automatically preheating the IC component to the lowest operational temperature threshold via a heater embedded within a heat sink of the host device that is selectively activated to generate heat, which increases the current temperature of the IC component, wherein the heater is a heater coil; and
 in response to the IC component being preheated to a temperature at or above the lowest operational temperature threshold, enabling operation of the IC component within the host device via application of system power to the IC component.

17. The method of claim 16, wherein the host device includes an embedded thermal diode that detects the current temperature of the IC component and when the current temperature of the IC component is below the lowest operational temperature threshold, the method further comprising:
comparing a forward bias voltage of the thermal diode with a pre-set reference forward bias voltage that represents the lowest operational temperature threshold of the IC component;
determining the current temperature of the IC component; and
the automatically preheating further comprises, activating the heater to pre-heat the host device when the current temperature of the IC component is less than the lowest operational temperature threshold of the IC component;
wherein the thermal diode is attached to the IC component and the heat sink.

18. The method of claim 17, the method further comprising:
initializing the host device to become operational;
maintaining a current temperature of the host device within an operating temperature range utilizing heat generated by the IC component as self-heating;
activating a feedback system in which the heater is selectively utilized in a regulated manner to attain and maintain the operating temperature range;
in response to the current the temperature of the host device falling below a lowest operating temperature threshold for the host device, activating the heater to combine heat generated from the heater with self-heating of the IC component to maintain the current temperature of the host device within an operating temperature range;
wherein the operating temperature range of the host device is extended to temperatures below ambient limits by an amount equal to the thermal rise of the IC component due to self-heating and heating from the heater.

19. The host device of claim 1, wherein the automatic pre-heating is completed during normal activation of the operation of the host device and not during a burn-in testing of the host device.

20. The method of claim 16, wherein the host device includes a plurality of IC components each having a separate heater and thermal diode, and each of the multiple components also having a corresponding lowest operational temperature, the method further comprising:
granularly activating the separate heater of only one or more specific IC components from among the plurality of IC components that have a current temperature that is below the corresponding lowest operational temperature to increase the current temperature of only the one or more specific IC components.

* * * * *